(12) United States Patent
Borlez

(10) Patent No.: US 8,384,586 B2
(45) Date of Patent: Feb. 26, 2013

(54) MIXER STRUCTURE FOR DOPPLER RADAR APPLICATIONS

(75) Inventor: Yves Borlez, Heure-le-Romain (BE)

(73) Assignee: BEA SA, Angleur (BE)

( * ) Notice: Subject to any disclaimer, the term of this patent is extended or adjusted under 35 U.S.C. 154(b) by 0 days.

(21) Appl. No.: 13/273,184

(22) Filed: Oct. 13, 2011

(65) Prior Publication Data

US 2012/0086595 A1 Apr. 12, 2012

Related U.S. Application Data

(62) Division of application No. 12/496,596, filed on Jul. 1, 2009, now Pat. No. 8,102,307.

(30) Foreign Application Priority Data

Jul. 17, 2008 (EP) .................................... 08012958

(51) Int. Cl.
*G01S 13/00* (2006.01)
(52) U.S. Cl. ............................. 342/61; 342/84; 342/105
(58) Field of Classification Search .................... 342/61, 342/84, 105
See application file for complete search history.

(56) References Cited

U.S. PATENT DOCUMENTS

| | | | |
|---|---|---|---|
| 3,310,748 A | 3/1967 | Howard | |
| 3,728,721 A | 4/1973 | Lee | |
| 3,893,021 A * | 7/1975 | Meador et al. | 324/341 |
| 4,070,639 A | 1/1978 | Nemit | |
| 4,896,374 A | 1/1990 | Waugh | |
| 5,596,325 A * | 1/1997 | Maas | 342/28 |
| 5,872,537 A * | 2/1999 | Siweris | 342/128 |
| 6,657,580 B1 * | 12/2003 | Edwards et al. | 342/51 |
| 2001/0027091 A1 * | 10/2001 | Kimishima | 455/209 |
| 2002/0102958 A1 | 8/2002 | Buer | |
| 2007/0035722 A1 * | 2/2007 | Tadakuma et al. | 356/73.1 |

FOREIGN PATENT DOCUMENTS

WO 9411755 A 5/1994

OTHER PUBLICATIONS

Ludger Verweyen et al: "Coplanar Integrated Mixers for 77-GHZ Automotive Applicaitons" IEEE Microwave and Guided Wave Letters, IEEE Inc. New York, US, vol. 8, No. 1. Jan. 1, 1998 XP011035264, ISSN: 1051-8207, p. 38, col. 2, Line 7-Line 20; Figure 1.
European Patent Application No. 08012958.8-2215, European Patent Office Action, Date Nov. 11, 2009, 6 pages.
European Patent Application No. 08012958.8-2215, European Search Report, Date Nov. 11, 2009.
Borlez, European Search Report, EP 08 01 2958, Apr. 28, 2009, Munich, Germany, Entire Document.
Jim Stiles, The 180 Degree Hybrid Coupler, The 180 Degree Hybrid 723, Apr. 19, 2006, p. 1-5, The University of Kansas, Department of EECS.

(Continued)

*Primary Examiner* — Timothy A Brainard
(74) *Attorney, Agent, or Firm* — Woodling, Krost and Rust

(57) ABSTRACT

A Mixer structure (210) for Doppler radar applications and a Doppler radar sensor (30) having an oscillator input port (LO) for output signals from an electric oscillator (32), having a radio frequency input port (RF) for output signals from receiving means (34), having an output port (IF) for an overall output intermediate signal produced in the mixer structure (210) and having two mixer branches (12a, 12b) each with a diode (18a, 18b). The mixer branches (12a, 12b) are connected to the oscillator input port (LO) and to the radio frequency input port (RF) in such a manner that intermediate signals (IF1, IF2), which are produced in these mixer branches (12a, 12b) and correspond to a Doppler shift between the oscillator signal and the radio frequency signal, are processed to the overall output signal.

25 Claims, 7 Drawing Sheets

OTHER PUBLICATIONS

Figure 1:
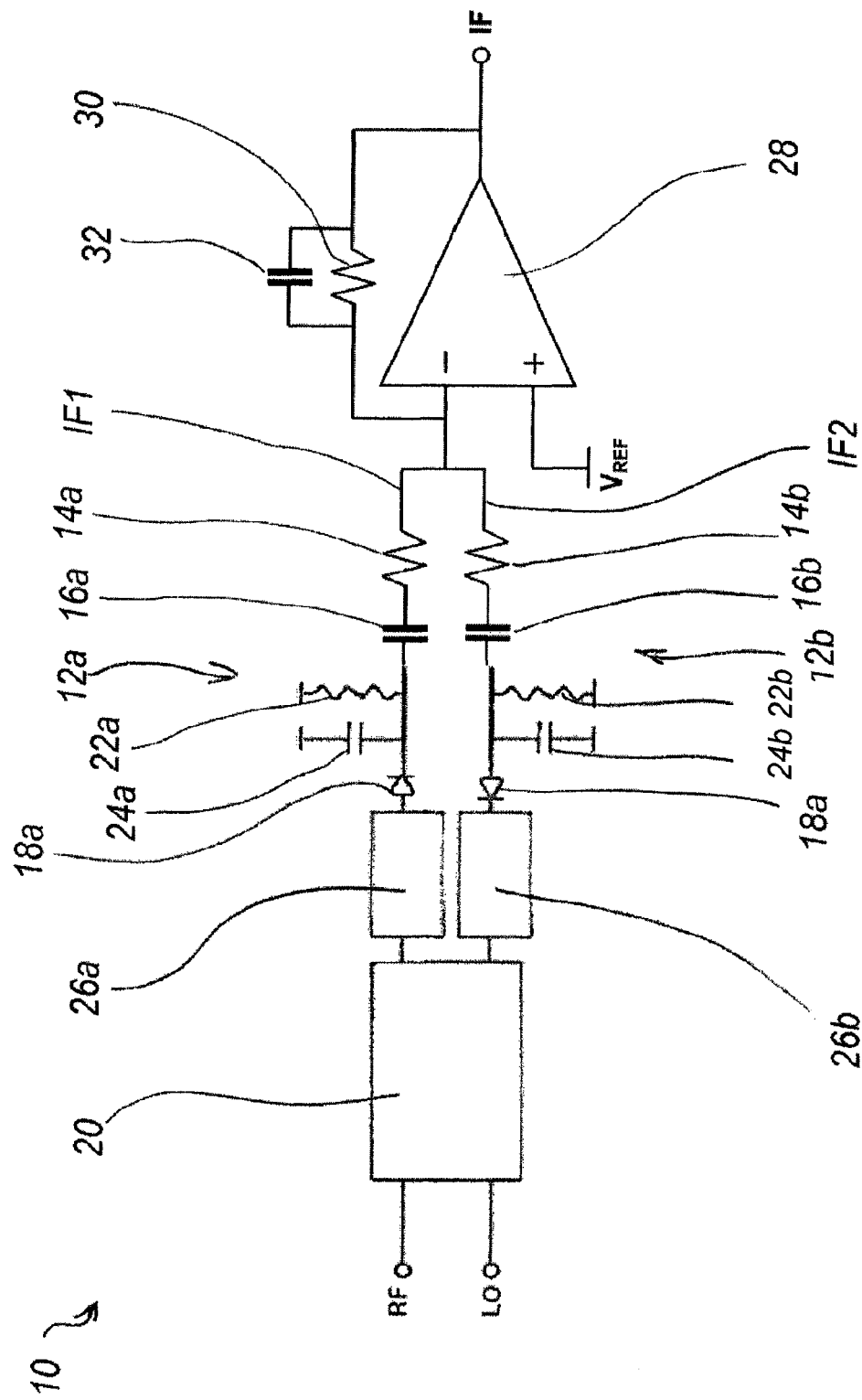

Jim Stiles, The 90 Degree Hybrid Coupler, The Quadrature Hybrid Coupler 723, Apr. 14, 2005, p. 1-4, The University of Kansas, Department of EECS.

M/ACOM An AMP Company, RF Directional Couplers and 3DB Hybrids Overview, M560, Application Note, www.MACOM.com, p. 10-5 to 10-14.

Cotter W. Sayre, Chapter 7, Mixer Design, Complete Wireless Design, Jun. 24, 2008, ISBN 0071544526/9780071544528, pp. 379-401, United States.

Hewlett Packard, The Schottky Diode Mixer, Application Note 995, pp. 1-8, 1986, USA.

* cited by examiner

MIXER STRUCTURE FOR DOPPLER RADAR APPLICATIONS

This is a divisional patent application of U.S. patent application Ser. No. 12/496,596 filed Jul. 1, 2009 now U.S. Pat. No. 8,102,307 and claims the benefit of and priority to said U.S. patent application Ser. No. 12/496,596 filed Jul. 1, 2009; U.S. patent application Ser. No. 12/496,596 filed Jul. 1, 2009 claims the benefit of and priority to European Patent Application No. 08 012 958.8 filed Jul. 17, 2008.

The present invention relates to a mixer structure for Doppler radar applications, The known mixer structure has an oscillator input port for output signals from an electric oscillator. Furthermore, a radio frequency input port for output signals from receiving means and an output port for an overall output signal produced in the mixer structure and two mixer branches each with a diode are provided. The mixer branches are connected to the oscillator input port and to the radio frequency input port in such a manner that intermediate signals, which are produced in these mixer branches and correspond to a Doppler shift between the oscillator signal and the radio frequency signal, are processed to the overall output signal.

Besides, the present invention relates to a Doppler radar sensor for usage with an automatic door.

Above-mentioned mixer structures are used in low cost microwave planar transceivers. The mixer structures can be used in different sensors, especially to provide a Doppler signal output from the mixing of the local oscillator signal coming from a microwave main oscillator with the received signal coming back from a target that is received on an antenna which acts as receiving means.

In known art mixer structures, the goal is to down convert the input of a radio frequency port, which is usually called RF port, into an output for an intermediate frequency port, usually called IF port. This is done by mixing the radio frequency with an input frequency at a local oscillator port, usually called LO port, and obtaining the difference as the intermediate frequency. As all of these frequencies are radio frequencies, the design of the mixer involves the matching of the three ports of the mixer structure to relatively low characteristic impedances such as 50 Ohms or 75 Ohms.

The known art mixer structures are based on a non-linearity by an active device such as a diode or a transistor. Known mixer structures, which are disclosed for example in "Microwave Mixers"; Stephen A. Maas; Artech House; ISBN 0-890006-171-8; or "Microwave Engineering"; David Pozar; Wiley; ISBN 0-471-17096-8; are using more than one diode mainly for the balancing of the mixer structures with respect to the LO, RF or IF ports. This balancing technique has advantages such as LO amplitude noise rejection, port isolation and spurious rejection.

In prior art single balanced mixer structures, the diodes are mounted in opposite and connected in parallel at the IF port. In such a configuration, the LO signal generates an equivalent amplitude noise on both diodes. This signal is in phase and is not depending on the electrical length between the LO port and the respective diodes. The diodes provide an opposite rectified noise that is cancelled by the sum of the two diode signals at the IF port. The inherent RF impedance of the mixer diodes in such a structure is rather low, which is not optimal for Doppler radar applications.

For low cost Doppler sensor applications, the constraints on the mixer structures can be quite different. When there is a movement of the Doppler sensor relative to a target, an alternating current (AC) rectified signal will be observed at the output of the mixer structure. The amplitude of the signal will be depending on the receiving antenna (RX) signal and its frequency will be strictly proportional to the target speed following the formula:

$$F_{Doppler} = 2 \cdot F_{Carrier} \cdot v/c \qquad \text{Equ. 1}$$

where c is the speed of tight, v is the speed of the target and FCarrier is the carrier frequency of the radar.

As the Doppler signal is usually a very low frequency signal, amplifiers used for the IF signals amplification are not radio frequency amplifiers but audio frequency (AF) amplifiers. Usually, simple low cost operational amplifiers are used. The AF amplifiers have input impedances which are rather high compared to the classical 50 Ohms of radio frequency amplifiers. A mixer structure with a low IF output impedance results in loss of signal. This is due to the bad matching between the operational amplifiers and the mixer structure. If higher signal amplitudes could be achieved at the output of the mixer structure, it would result in the need of less gain, saving cost on the device.

With known art Doppler sensors the diodes need to be very well matched to ensure a perfect cancellation. There is no possibility of adjustment. As the diodes are connected in direct current (DC), the current flowing between the diodes makes them having inherently low radio frequency impedances. This impedance is difficult to determine and the diode matching procedure as well.

The WO 94/11755 discloses a Doppler sensor, in particular for speed measurement of vehicles with a frequency generator and with a transmission and reception unit. The transmission and reception unit is connected to the frequency generator via a waveguide. Two diodes are acting as a mixer which receive the signals in the waveguide at intervals of an eighth of a wavelength, so that, when these signals are not linearly superimposed, signals phase-shifted through 90° are obtained at the outputs of the diodes. From the outputs of the diodes a sufficiently low-noise signal is obtained by differentiation in a differentiator. The low-noise signal contains the difference between the frequency generated by the frequency generator and the Doppler-shift frequency of the reflected and received signal as an intermediate frequency. From the intermediate frequency the amount of the relative speed to be measured is determined in an evaluation unit.

The U.S. Pat. No. 5,596,325 A describes a radar sensor especially designed to detect the direction of the movement of a recognized object. Therefore the radar application comprises two separate channels, one separate I and one separate Q channel. Both channels are processed separately to detect the direction of the movement by measuring the phase shift between IF signals of each channel. Each channel comprises an unbalanced single mixer structure to gain an IF signal for each channel. The mixer, to gain the IF signal is not optimized in order to improve the output signal.

"Coplanar Integrated Mixers for 77 GHz automotive applications" IEEE Microwave and guided wave letters Vol. 8 No. 1 January 1998 L. Veayen et al, —is focused on a coplanar integration of different mixer structures, comparing a single balanced diode mixer to other mixer-types. This paper does not relate to improve mixer structures, but discloses a single balanced diode mixer structure according to the state of the art and a cheap way to implement it on GeAs substrate. The mixer proposed in this paper is not optimized in order to improve the overall output signal.

It is an object of this invention to optimise the amplitude of the overall output signal of the mixer structure.

It is known state of the art, that a mixer comprises a LO input port and a RF input port. Both input ports are connected to a common IF output port via two mixer branches, where each mixer branch generates a partial intermediate frequency signal of the applied LO and RF signal. The partial intermediate frequency signals are processed to an overall output intermediate signal. Furthermore each mixer branch due to the state of the art comprises a diode and a decoupling capacitance in parallel with the diode.

According to the invention, each mixer branch includes a rectifier circuit having a diode, a load resistor in parallel with a diode, a series resistor and a series capacitance which are series-connected to the diode. Each load resistor is in parallel with the diode, in order to provide a separate DC return for each diode. This setting is advantageous, because the polarization of each diode can be set independently. So each diode can work at its optimum DC-point. Due to this, the impedance level of each diode can be controlled in a way, to optimize the IF signal captured by each diode.

The drawback of an increased difficulty in combining the signals from each diode—because each of them may have a different DC polarization—is overcome by the series capacitance in each branch, which leads to an IF—AC coupling of the mixer branches.

According to the invention the efficiency of each diode can be optimized as they would work alone and the signals still can easily be recombined.

Advantageously the two intermediate signal outputs of the rectifier branches can be combined in alternating current by linking the two rectifier branches outputs to optimise the amplitude of the available intermediate frequency signal for Doppler radar applications.

As mentioned above the capacitances remove the direct current voltage generated by the oscillator. Thereby the branches, which act as rectifiers, can be designed and optimized separately to get the best performance. So measurements on the branches are much easier and reproducible. The design is more flexible to the use of several different diodes.

According to the invention each mixer branch includes rectifier circuit having a diode, a load resistor in parallel with the diode, a decoupling capacitor in parallel with the diode, a series resistor and a series capacitance which are series-connected to the diode.

According to the invention, the two intermediate signal outputs of the rectifier branches can be combined in alternating current by linking the two rectifier branches outputs to optimise the amplitude of the available intermediate frequency signal for Doppler radar applications. The capacitances remove the direct current voltage generated by the oscillator. Thereby the branches, which act as rectifiers, can be designed and optimized separately to get the best performance. So measurements on the branches are much easier and reproducible. The design is more flexible to the use of several different diodes.

In particular, the matching of the impedances of the branches and the impedances of the input signal lines can easily be implemented and optimized. The branches give higher intermediate voltages, because they can be optimized with higher load impedances.

In a preferred embodiment the diodes can be mounted in opposite directions. Thereby the local oscillator signal noise, rectified by one diode, is cancelled by the one of the other diode, while the intermediate signals are in phase and summed up. This provides a good oscillator amplitude noise rejection.

Preferably, each mixer branch can include a matching circuit to match the input impedance of the rectifier circuit with the impedance of a radio frequency input port line. Further a voltage step up can be reached with such a matching network. So the intermediate signals are optimised.

In another very advantageous embodiment the mixer branches are connected to the oscillator input port and to the radio frequency input port by way of a 180° or 90° hybrid coupler, especially a 180° rat-race coupler or a 90° branchline coupler. With a hybrid based coupler a single balanced mixer can easily be realized to improve the balancing of the mixer with respect to the oscillator input port, the radio frequency input port and the output signal port. This balancing technique has advantages such as oscillator signal amplitude noise rejection, port isolation and spurious oscillation rejection.

Further the mixer branches can easily be connected with the output port by way of an operational amplifier in such a manner that the intermediate signals will be added to produce the overall output signal. Thereby the operational amplifier will add up the intermediate signals and cancel the oscillator amplitude modulation (AM) noise signal. By adjusting the series resistances feeding the operational amplifier, it is possible to achieve an optimal oscillator noise cancellation, even with non matched diodes. With the inventive capacitive AC (alternating current) coupling the signals are retrieved and summed into the operational amplifier without changing the two different DC polarisations of the respective diodes and their RF input impedance accordingly.

The advantageous Doppler radar sensor includes at leaf one inventive mixer structure, which is inserted between the oscillator and the receiving and transmission means of the Doppler sensor. According to the invention a single receiving and transmission means, in particular an antenna, can be used for both transmit and receive. The mixer structure is coupled to a main line between the oscillator and the receiving and transmission means in such a way that it is fed by the local oscillator power from the oscillator and the radio frequency signal coming from the receiving and transmission means, while allowing a part of the oscillator power to be sent to the receiving and transmission means. In this way an optimised low cost Doppler radar sensor can be realized.

In a preferred embodiment the mixer structure can include a 3 dB coupler to retrieve the oscillator signal and the radio frequency signal required by the mixer structure, while leaving half of the oscillator signal power to reach the receiving and transmission means and to be transmitted. Such couplers are reliable and cheap.

Sometimes it is desirable to determine the direction of a movement of a target relative to the Doppler radar sensor, respectively if the target approaches the sensor or if it moves away. To achieve such functionality, the improved Doppler sensor can have two mixer structures, which can be inserted between the oscillator and the receiving and transmission means, whereby the two mixer structures are positioned on two parallel arms in a way, that their 3 dB couplers are shifted by one eighth of the wavelength of a signal wave relative to each other. Such a dual mixer architecture provides two channels. The processing of these two channels will give the direction of the movement.

The known Doppler radar sensor having at least one mixer structure including a transmission line section, which is inserted in between an oscillator and a receiving and transmission means and with which mixer diodes are connected to at different points to pick off a signal wave.

According to a Doppler radar sensor of the invention the transmission line section has the length of a multiple of half a wavelength of the signal wave, the transmission line section is of different characteristic impedance as the lines coming from the oscillator and from the receiving and transmission means and the impedance of the transmission line section is adjusted to adjust the oscillator signal ratio between the receiving and transmission means and the mixer structure. Such a transmission line section is straightforward and has no effect on the standing wave ratio along the line between the oscillator and the receiving and transmission means as it is inserted.

Advantageously the two diodes in the branches are mounted in opposite directions and separated by a quarter wavelength of the signal wave along the transmission line section to provide oscillator amplitude noise cancellation, while delivering Doppler signal. At the respective positions of the diodes at the transmission line section the phase of the oscillator signal amplitude noise remains the same. The radio frequency signal, once mixed with the oscillator signal gives 180° phased intermediate frequency signals.

A further improved dual channel Doppler radar sensor can have two mixer structures with transmission line section which can be inserted between the oscillator and the receiving and transmission means in such a way that the mixer branches of the mixer structures having a shift of one eighth of the wavelength of the signal wave relative to each other. Such an inline mixer approach provides a straightforward implementation of two channels to determine the direction of the movement.

A further simplified single or dual channel Doppler radar sensor can have simplified inline mixer structures where a capacitance is provided to decouple the mixer diodes in each channel.

Especially, the mixer diodes are directly connectable to each other and to a unique load resistor.

According to a further aspect of the invention a unique series resistor and capacitor is used for the connection to the operational amplifier.

This solution provides less voltage gain but is simpler. This structure is similar to the classical approach described in the state of the art but is applied to the new described inline structures.

The inventive Doppler radar sensor for usage with an automatic door, has at least one inventive mixer structure which is cheap, robust and reliable.

Further advantages and possible applications of the present invention become apparent from the following detailed description with reference to the amplifying embodiments illustrated by way of example in the drawings.

Figure 2:
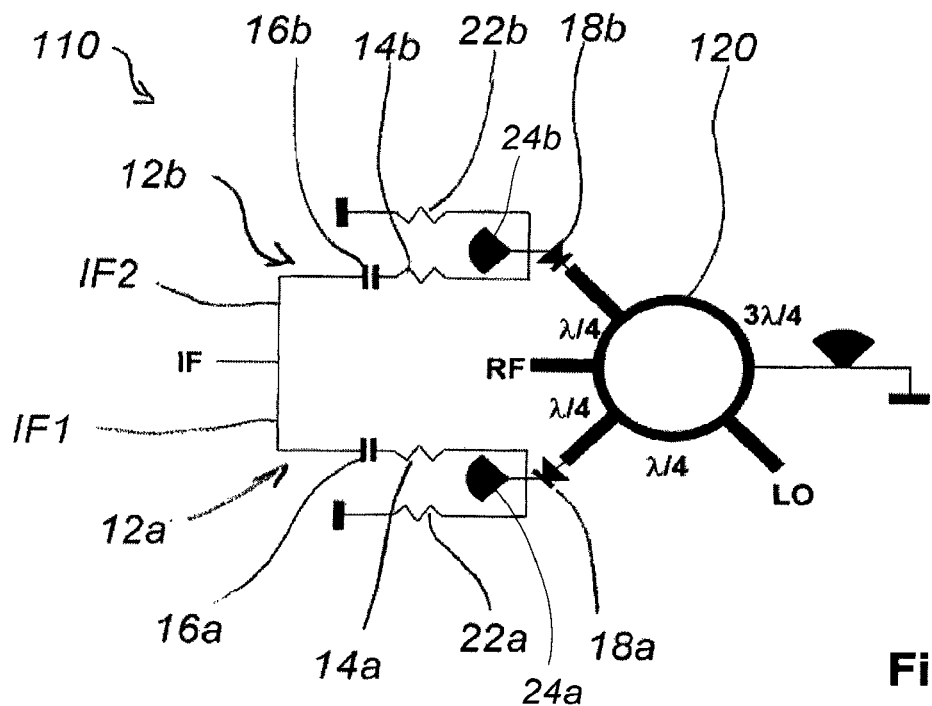
Figure 3:
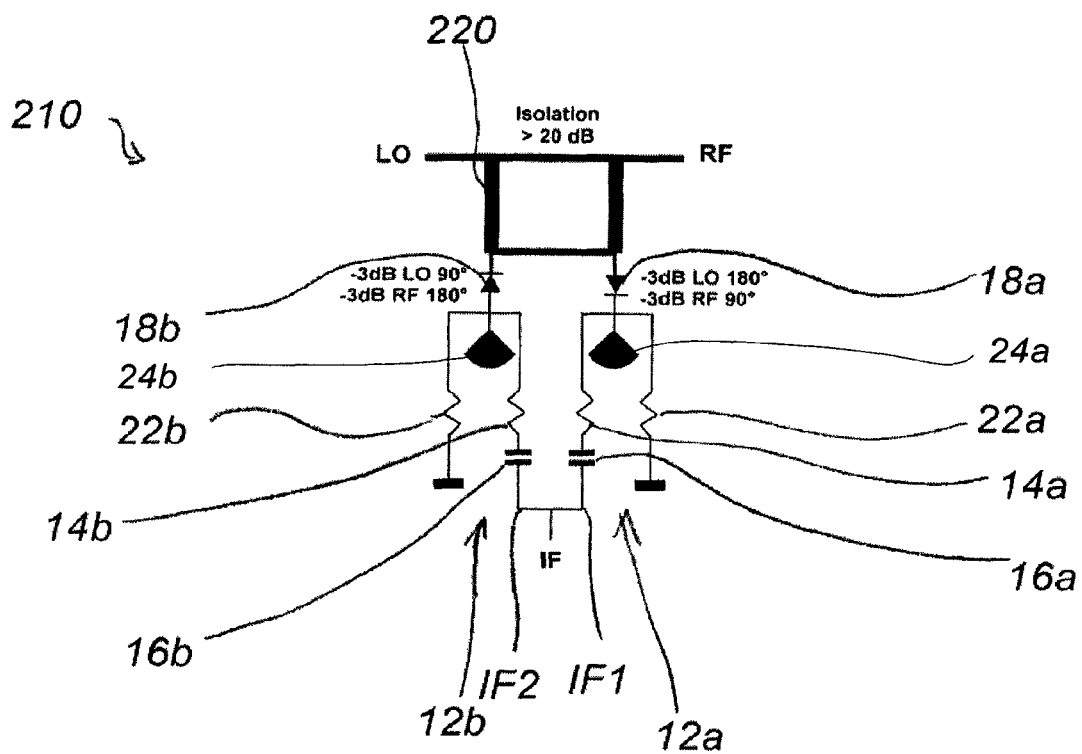
Figure 4:
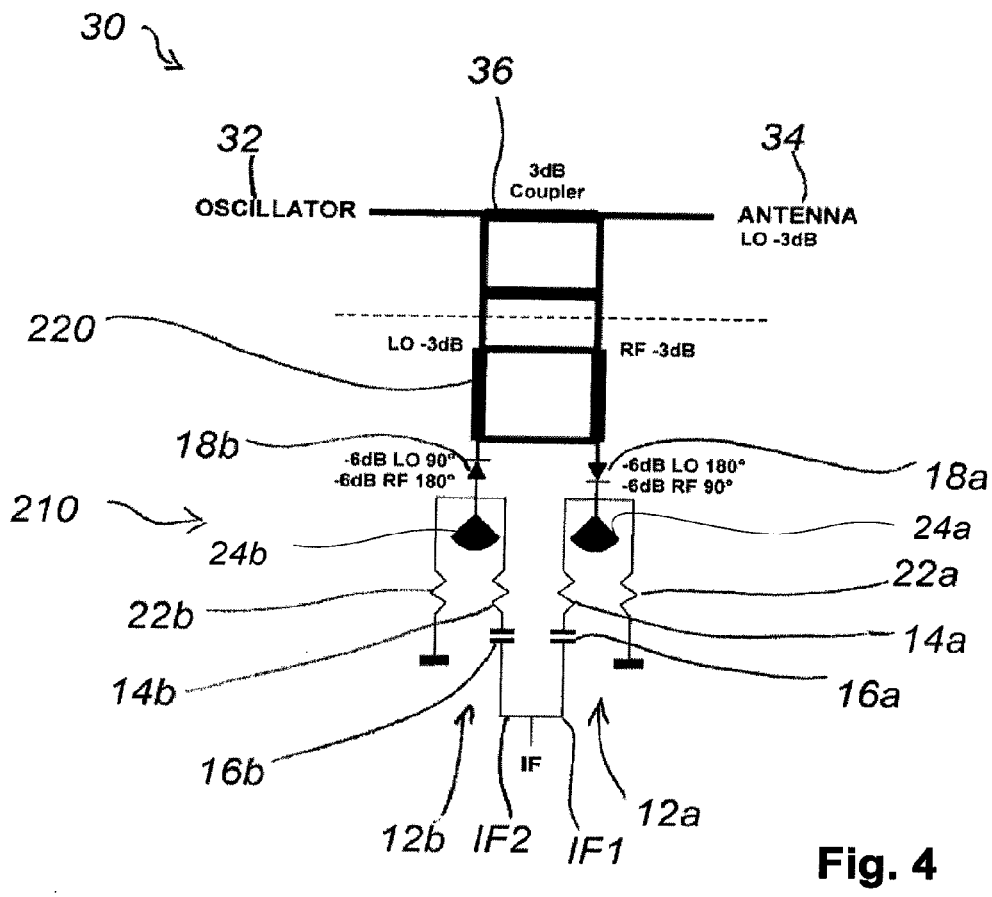
Figure 5A:
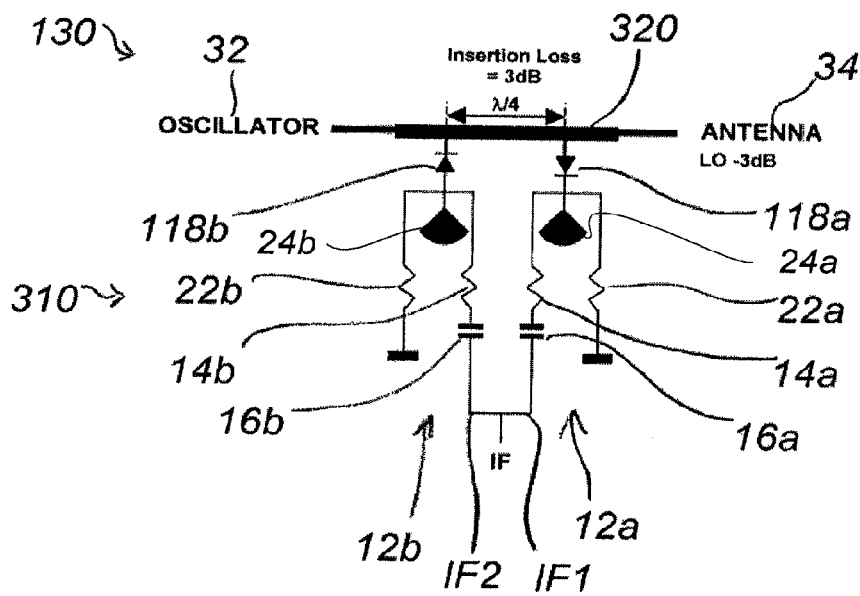
Figure 5B:
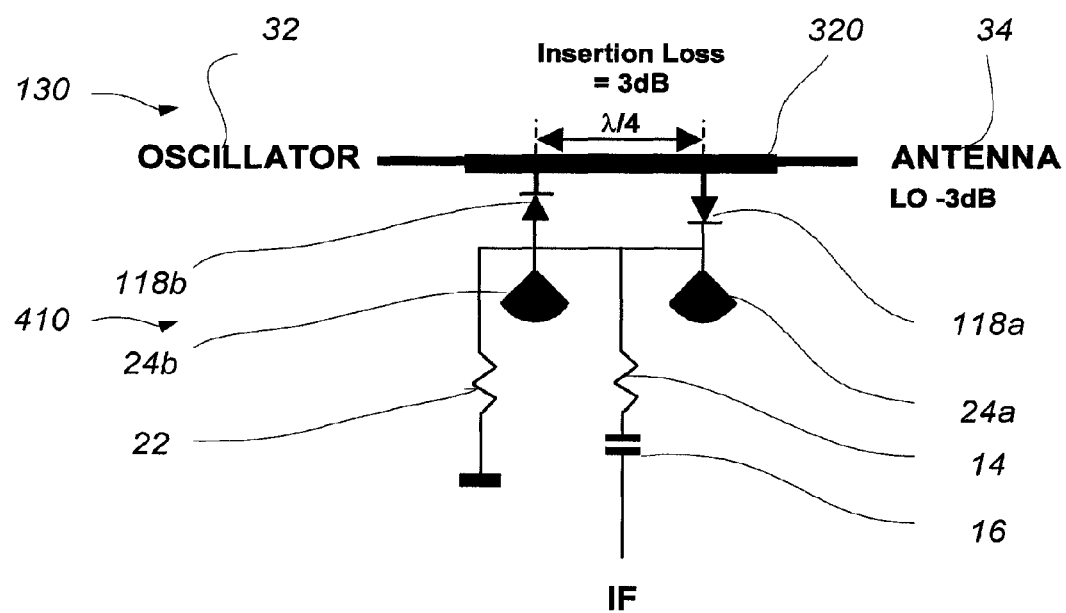
Figure 6A:
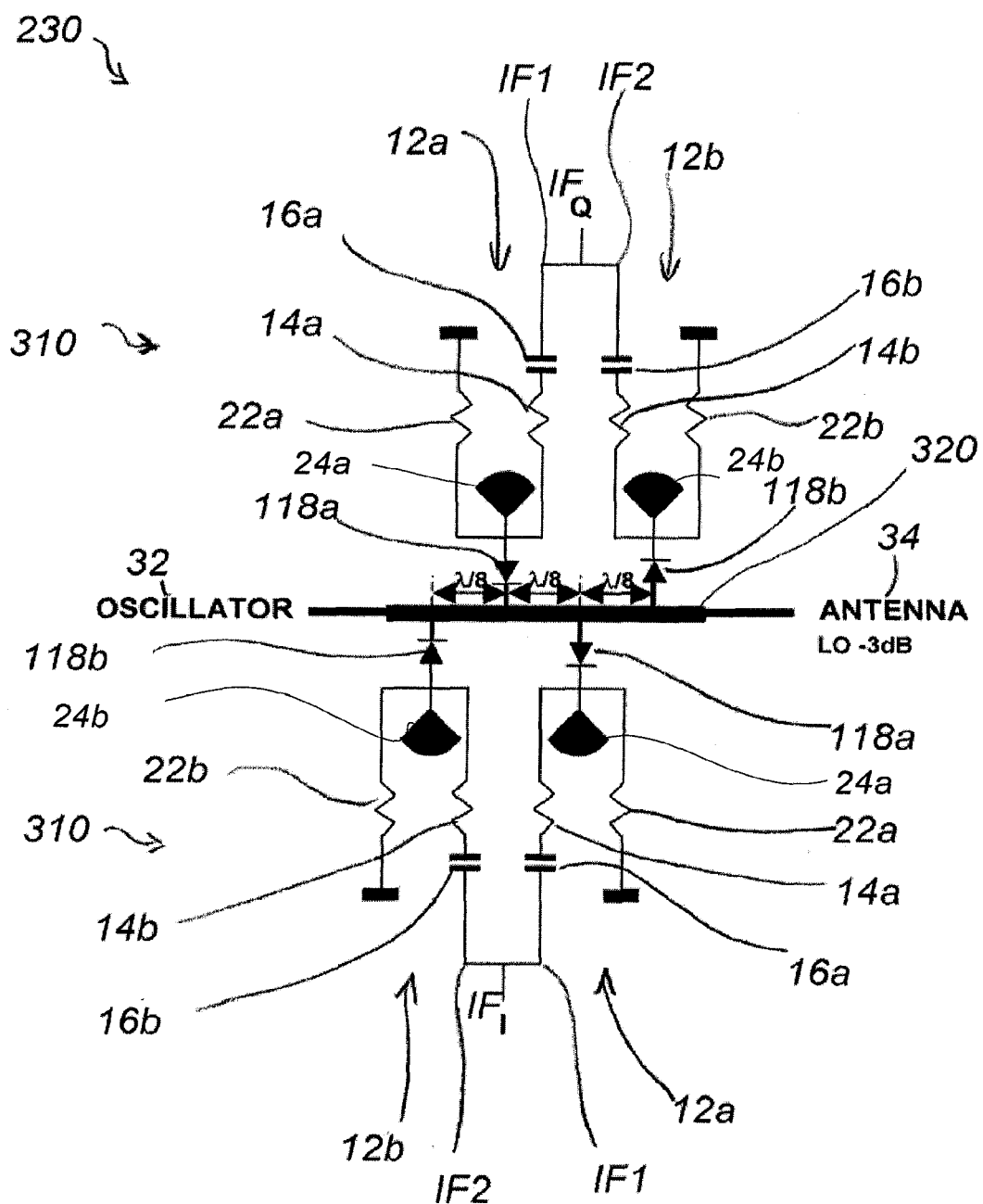
Figure 6B:
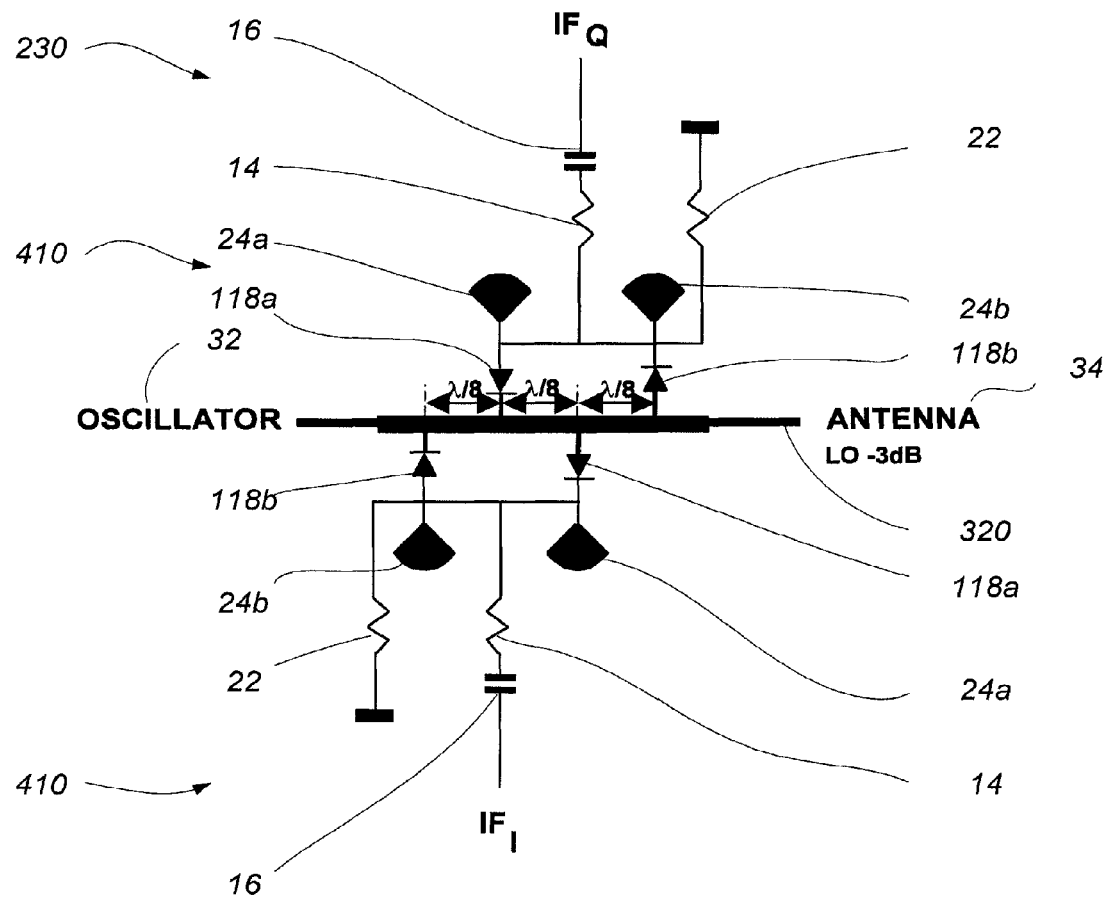
Figure 7:
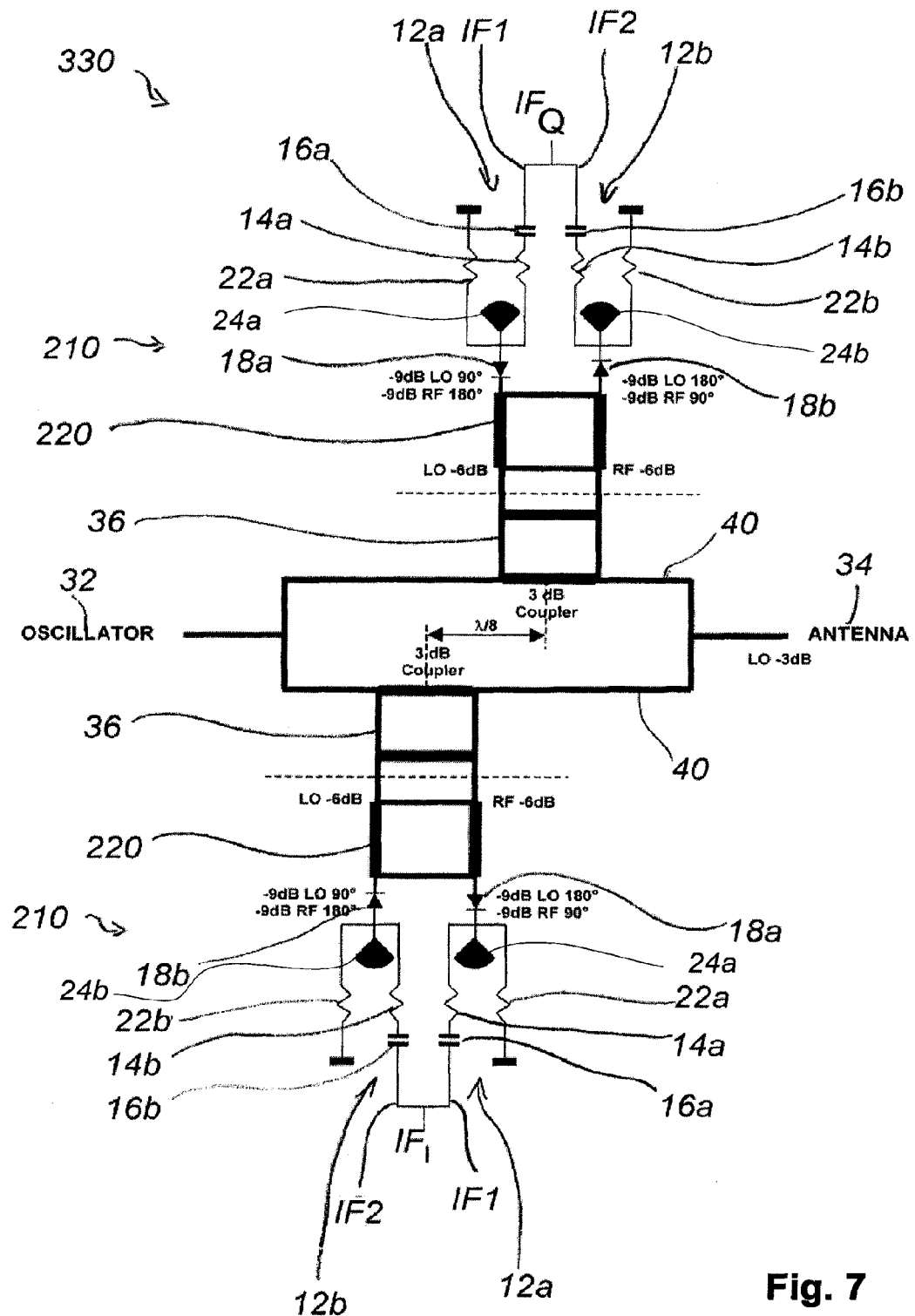

In the description, the appended claims, the abstract and in the drawings, use is made of the terms and corresponding reference numerals summarized in the best provided of the description. In the drawings in shown:

FIG. 1 a schematically first embodiment of a mixer structure for Doppler radar applications, which has two branches each with a series resistor and a series capacitance which are series-connected to a diode;

FIG. 2 a schematically second embodiment of a mixer structure which is similar to the mixer structure shown in FIG. 1, whereby the two branches are connected to a 180° rat-race coupler;

FIG. 3 a schematically third embodiment of a mixer structure which is similar to the mixer structures shown in FIGS. 1 and 2, whereby the two branches are connected to a 90° hybrid coupler;

FIG. 4 a schematically first embodiment of a Doppler radar sensor, whereby the mixer structure shown in FIG. 3 is inserted between an oscillator and an antenna of the Doppler sensor;

FIG. 5a a schematically second embodiment of a Doppler radar sensor which is similar to the Doppler radar sensor shown in FIG. 4, whereby the two branches are connected to a transmission line section inserted between the oscillator and the antenna;

FIG. 5b a schematically simplified embodiment of a Doppler radar sensor which is similar to FIG. 5a, whereby the two branches are connected to a transmission line section inserted between the oscillator and the antenna and whereby the two mixer diodes are decoupled by a capacitance, DC coupled to each other and connected to the amplifier by a series resistor and capacitance;

FIG. 6a a schematically dual channel Doppler radar sensor which bases on two single channel Doppler radar sensors shown in FIG. 5;

FIG. 6b a schematically simplified embodiment of a Doppler radar sensor which is similar to FIG. 6a, whereby the two branches of each channel are connected to a transmission line section inserted between the oscillator and the antenna and whereby the two mixer diodes are decoupled by a capacitance, DC coupled to each other and connected to the amplifier by a series resistor and capacitance, and FIG. 7 a schematically dual channel Doppler radar sensor which bases on two single channel Doppler radar sensors shown in FIG. 4.

FIG. 1 shows a first embodiment of a mixer structure 10 for a Doppler radar sensor for usage with an automatic door. The carrier frequency of the radar is preferably 24.125 GHz.

The mixer structure 10 has a local oscillator input port LO for output signals from an electric oscillator and an antenna radio frequency input port RF for output signals from an antenna. It has further an intermediate frequency output port IF for an overall output signal produced in the mixer structure 10.

The mixer structure 10 has two mixer branches 12a and 12b each with a load resistor 22a and 22b, decoupling capacitance 24a and 24b, series resistor 14a and 14b and a series capacitance 16a and 16b which are series-connected to a diode 18a and 18b. The diodes 18a and 18b of the two branches 12a and 12b are mounted in opposite direction.

The mixer branches 12a and 12b are connected to the LO port and to the RF port by way of a 180° or 90° hybrid based coupler 20 in such a manner that intermediate signals IF1 and IF2, which are produced in the mixer branches 12a and 12b and correspond to a Doppler shift between the LO signal and the RF signal, are processed to the overall IF output signal. The two branches 12a and 12b act as rectifiers on each output of the hybrid coupler 20, one giving positive voltage and the other one negative voltage.

In order to increase the RF input impedance of the diodes 18a and 18b, there is no direct DC link between the two diodes 18a and 18b, so that the two branches 12a and 12b of the mixer structure 10 are considered separately. The increased diode RF input impedance effects an increase of the signal amplitude of the IF1 and IF2 signals. This is very positive, especially in combination with amplifiers for the IF signals, which are of relative high impedance. Since both diodes 18a and 18b are not directly linked, there is no polarisation current flowing between the diodes 18a and 18b and the RF impedance of the diodes 18a and 18b is not decreased.

Between each branch 12a and 12b and the ground a resistor 22a respectively 22b is placed as a load that will convert the current of the IF1 signal respectively the IF2 signal generated by the relevant diode 18a or 18b into a voltage. A decoupling capacitance 24a and 24b is used for each branch 12a and 12b to provide a ground to the RF signal.

A matching circuit 26a and 26b is used in each branch 12a and 12b as an impedance transformer to make the transition between the low impedance (typically 50 Ohms) of the output lines of the hybrid coupler 20 and the higher impedance of the diodes 18a and 18b. The matching circuits 26a and 26b are impedance step ups and also voltage step ups. This means that the RF voltage across the diodes 18a and 18b will be higher, generating a higher rectified IF1 or IF2 signal voltage.

The two mixer branches 12a and 12b are connected with the IF output port by way of an operational amplifier 28 in such a manner that the IF1 and IF2 signals will be added to produce the overall output signal. For this the two IF1 and IF2 outputs of the branches 12a and 12b are combined in AC into the inverting input (−) of the operational amplifier 28. The capacitances 16a and 16b of the branches 12a and 12b thereby remove the DC voltage generated by the LO signal that is positive for one diode 18a or 18b and negative for the other diode 18b respectively 18a.

The IF output port of the operational amplifier 28 is connected to the inverting input (−) via a parallel connection of a resistor 30 and a capacitance 32, providing feedback and gain setting. The non-inverting input (+) of the operational amplifier 28 is connected to a reference voltage VREF.

The operational amplifier 28 will make the addition of the IF1 and IF2 signals of the two branches 12a and 12b and the cancellation of the LO AM noise signal.

In a Doppler radar sensor the LO wave is superposed with the RF signal reflected from the target and the mixer diodes 18a and 18b will rectify the instantaneous amplitude of the resulting signal. The amplitude variation of the signal rectified by the diodes 18a and 18b is the intermediate Doppler frequency. Both diodes 18a and 18b will thereby receive the LO AM noise, which will be independent on the relative phase between LO and RF signals. The Doppler IF signal will in this way be detected by the two branches 12a and 12b acting as two separate detectors and will have phase relationship that allows the sum of the IF1 and IF2 signals and the cancellation of the LO AM noise. The simple AC coupling adds the Doppler signal coming from the two branches and cancel the LO amplitude noise, while preserving separate diodes DC polarisations.

FIG. 2 shows a second embodiment of a mixer structure 110 which is similar to the first embodiment shown in FIG. 1. The elements which are identical to those of the first mixer structure 10 have the same reference marks, so that their description will refer to the explanation of the first embodiment. Unlike to the first embodiment, the two branches 12a and 12b are connected to a 180° rat-race coupler 120.

The LO port, the RF port and the ports for connecting the branches 12a and 12b are connected at different points along the rat-race coupler 120. The phase shift between the ports of the rat-race coupler 110 are as follows:
LO port to the branch 12a: a quarter of a signal wavelength ($\lambda/4$);
branch 12a to the RF port: a quarter of a signal wavelength ($\lambda/4$);
RF port to the branch 12b: a quarter of a signal wavelength ($\lambda/4$);
branch 12b to LO port: three quarter of a signal wavelength ($3\lambda/4$).

The diode matching circuits and the operational amplifier are omitted in the second embodiment. The branches 12a and 12b combine directly to the IF port of the mixer structure 110.

The mixer structure 110 has a pretty good isolation between LO and RF ports.

In FIG. 3 a third, embodiment of a mixer structure 210 is shown. The third embodiment is similar to the second embodiment shown in FIG. 2. Unlike to the second embodiment the two branches 12a and 12b are connected to the outputs of a 90° hybrid branchline coupler 220.

The hybrid coupler 220 generates 90° phase shifted signals for the polarization of the diodes 18a and 18b with the LO signal and −90° phase shifted signals for the RF reception of the RF signal by the diodes 18a and 18b.

FIG. 4 represents a first embodiment of a single channel Doppler radar sensor 30. A mixer structure 210 shown in FIG. 3 is inserted between an oscillator 32 and an antenna 34 of the Doppler radar sensor 30. The single antenna 34 is used for both transmit and receive. The elements which are identical to those of the mixer structure 210 shown in FIG. 3 have the same reference marks, so that their description will refer to the explanation of the mixer structure 210 shown in FIG. 3.

The oscillator input port LO is connected via a 3 dB coupler 36 to the oscillator 32 and the radio frequency input port (RF) is connected via the 3 dB coupler 36 to the antenna 34. With the 3 dB coupler 36 the oscillator signal and the antenna signal required by the mixer structure 210 are retrieved, while leaving half of the oscillator signal power to reach the antenna 34 and to be transmitted.

FIG. 5a shows a second embodiment of a single channel Doppler radar sensor 130 which is similar to the single channel Doppler radar sensor 30 shown in FIG. 4. Unlike to the first embodiment a transmission line section 320 is inserted in between the oscillator 32 and the antenna 34. The mixer branches 12a and 12b with two Diodes 118a and 118b are connected to the transmission line section 320 at different points to pick. As the transmission line section 320 is multiple of half a wavelength of a signal wave ($n\lambda/2$) the impedance seen on one side is equal to the impedance seen on the other side. This means that the transmission line section 320 has no effect on the standing wave ratio along the line between the oscillator 32 and the antenna 34 as it is inserted. The transmission line section 320 is of different characteristic impedance and its impedance is adjusted to adjust the oscillator signal ratio between the antenna 34 and the mixer structure 310.

The two Diodes 118a and 118b have similar functions as the diodes 18a and 18b in the other embodiments shown in FIGS. 1 to 4. They are mounted in opposite directions and separated by a quarter wavelength ($\lambda/4$) of the signal wave along the transmission line section 320 to provide oscillator amplitude noise cancellation, while delivering Doppler signal. The Diodes 118a and 118b pick up a part of the voltage propagating across the transmission line section 320 and cause the mixing between forward LO power and returned RF power from the target, By adjusting the characteristic impedance of the transmission line section 320, it will be possible to adjust the ratio between the LO energy which is sent to the antenna 34, relative to the LO energy sent to the mixer structure 310. At the respective positions of the Diodes 118a and 118b along the transmission line section 320, the LO amplitude noise remains the same, but the RF signal, once mixed with the RF signal gives 180° phased IF1 and IF2 signals. With the two Diodes 118a and 118b in opposite positions, the IF Doppler signal is retrieved and the LO amplitude noise is cancelled. The fact that two signals out of phase are subtracted, maximize their sum and the noise cancellation improves the signal-to-noise ratio.

FIG. 5b shows a simplified embodiment of FIG. 5a where the two diodes are decoupled by a capacitor 24a, 24b, and then DC connected to each other and to a load resistor 22 that will convert the IF current generated by the diodes into a voltage that is fed to the operational amplifier by the unique resistor 14 and capacitor 16. This structure provides less voltage gain but can be sometimes easier to manufacture. It is also the application of the classical mixer circuits to the inline mixer configuration.

FIG. 6a shows a dual channel Doppler radar sensor 230 which bases on two single Doppler radar sensor 130 shown in FIG. 5a. The dual channel Doppler radar sensor 230 has two channels with IFI and IFQ output ports for direction sensing. The elements which are identical to those of the single channel Doppler radar sensor 130 shown in FIG. 5a have the same reference marks, so that their description will refer to the explanation of the single channel Doppler radar sensor 130.

To realize two channels the two mixer structures 310 are inserted between the oscillator 32 and the antenna 34 in such a way that the mixer branches 12a and 12b of the mixer structures 310 having a shift of one eighth of the wavelength (λ/8) of the signal wave relative to each other, whereby the diodes 118a and 118b are placed quarter of the wavelength (λ/4) apart. This means the mixer structures 310 have a shift of 45° along the transmission line section.

By interleaving the respective diodes 118a and 118b of the two mixer structures 310 and keeping a separation distance over the transmission line section 320 of λ/8, it is possible to get the IFI and IFQ channels out of two branches 12a and 12b each, having the same properties of LO amplitude noise cancellation and Doppler signal summation. As the two channels IFI and IFQ are shifted by one eighth of the wavelength λ/8 along the transmission line section 320, the phasing between the IFI signal and the IRQ signal will be 90° as required. It is possible to determine the direction of the movement by processing of the IFI signal and the IFQ signal. It can be determined if a target approaches the sensor 230 or if it moves away.

A further benefit is that it would be detected as a wrong behaviour if one of the diodes 118a or 118b in the branches 12a or 12b has a problem.

FIG. 6b shows a simplified embodiment of FIG. 6a where the two diodes of each channel are decoupled by a capacitor 24a, 24b, and then DC connected to each other and to a load resistor 22 that will convert the current generated by the diodes into a voltage that is fed to the operational amplifier by the unique resistor 14 and capacitor 16. This structure provides less voltage gain but can be sometimes easier to manufacture. It is also the application of the classical mixer circuits to the inline mixer configuration.

FIG. 7 shows an alternative dual channel Doppler radar sensor 330 which bases on two Doppler radar sensors 30 shown in FIG. 4. Two mixer structures 210 similar to that shown in FIG. 3 are inserted between the oscillator 32 and the antenna 34. The two mixer structures 310 are positioned on two parallel arms 40 in a way, that their 3 dB couplers 36 are shifted by one eighth of the wavelength (λ/8) of a signal wave relative to each other.

The outputs of the two mixer structures 210 realize two channels IFI and IFQ, which are similar to the channels IFI and IFQ of the dual channel Doppler radar sensor 230 shown in FIG. 6. The processing of the two channels IFI and IFQ will give the relative direction of movement of the target to the dual channel Doppler radar sensor 230.

All described mixer structures 10; 110; 210; 310 respectively all described Doppler radar sensors 30; 130; 230; 330 can also be used for applications other than automatic doors.

Instead of single antenna approaches the Doppler radar sensors 30; 130; 230; 330 can also be realized as dual antenna approaches, where one antenna is used as a transmitter (TX) and one antenna is used as a receiver (RX). The LO port of the mixer structures 10; 110; 210; 310 is then connected via a splitter with the oscillator 32 and direct with the RX. The RF signal is clearly available to feed the mixer structure 10; 110; 210; 310. An isolation of for instance more than 20 dB between LO port and RF port is required to avoid radiation pattern distortion of the antenna.

LIST OF REFERENCE SIGNS

10 Mixer Structure
12a Mixer Branches
12b Mixer Branches
14 Series Resistor
14a Series Resistor
14b Series Resistor
16 Series Capacitance
16a Series Capacitance
16b Series Capacitance
18a Diode
18b Diode
20 Hybrid Coupler
22 Load Resistor
22a Load Resistor
22b Load Resistor
24a Decoupling Capacitance
24b Decoupling Capacitance
26a Matching Circuit
26b Matching Circuit
28 Operational Amplifier
30 Radar Sensor
32 Oscillator
34 Antenna
36 3 dB Coupler
110 Mixer Structure
118a Diode
118b Diode
120 180° Rat-race Coupler
130 Radar Sensor
210 Mixer Structure
220 90° Hybrid Coupler
230 Radar Sensor
310 Mixer Structure
320 Transmission Line Section
IF1 Signal
IF2 Signal

The invention claimed is:
1. Mixer circuit, comprising:
an oscillator signal;
an oscillator input port;
said oscillator input port (LO) in communication with said oscillator signal;
a radio frequency signal;
a radio frequency input port (RF) in communication with said radio frequency signal;
two mixer branches (12a, 12b), each mixer branch (12a, 12b) includes a rectifier circuit having a diode, a load resistor (22a, 22b), a decoupling capacitor (24a, 24b), a series resistor (14a, 14b) and a series capacitance (16a, 16b);
said mixer branches (12a, 12b) are respectively connected to said oscillator input port (LO) and to said radio frequency input port (RF), said two mixer branches produce intermediate signals (IF1, IF2);
said intermediate signals (IF1, IF2) correspond to a Doppler shift between said oscillator signal and said radio frequency signal; and,
an output port outputting an overall output intermediate signal.
2. Mixer circuit according to claim 1 wherein said diodes are mounted in opposite directions.

3. Mixer circuit according to claim 2 wherein each said mixer branch (12a, 12b) includes a matching circuit (26a, 26b) to match the input impedance of said mixer branch (12a, 12b) with the impedance of said radio frequency input port and said oscillator input port.

4. Mixer circuit according to claim 3 further comprising a 180° or 90° hybrid coupler interposed between said mixer branches (12a, 12b) and said oscillator input port (LO) and said radio frequency input port (RF).

5. Mixer circuit according to claim 4 further comprising an operational amplifier, said mixer branches (12a, 12b) are AC connected with said operational amplifier (28), said operational amplifier summing said intermediate signals (IF1, IF2) to produce an output signal (IF).

6. Mixer circuit according to claim 5, wherein said coupler is a 3 dB coupler (36) to retrieve said oscillator signal and said radio frequency signal, while leaving half of the oscillator signal power for said receiving and transmission means (34).

7. Mixer circuit according to claim 1 wherein each said mixer branch (12a, 12b) includes a matching circuit (26a, 26b) to match the input impedance of said mixer branch (12a, 12b) with the impedance of said radio frequency input port and said oscillator input port.

8. Mixer circuit according to claim 1 further comprising an operational amplifier, said mixer branches (12a, 12b) are AC connected with said operational amplifier (28), said operational amplifier summing said intermediate signals (IF1, IF2) to produce an output signal (IF).

9. Mixer circuit according to claim 1 wherein said mixer branch (12a) is separated from said mixer branch (12b) by a quarter wavelength.

10. Mixer circuit according to claim 1 further comprising an automatic door, and wherein said circuit controls said automatic door.

11. Mixer structure, comprising:
an oscillator generating oscillator signals;
an oscillator input port (LO);
said oscillator input port (LO) in electrical communication with said oscillator signals generated by said oscillator;
a receiving and transmission means;
a radio frequency input port (RF);
said radio frequency input port (RF) in electrical communication with said receiving and transmission means;
a first mixer circuit, said first mixer circuit includes: two mixer branches (12a, 12b), each said mixer branch (12a, 12b) includes a rectifier circuit having a diode, a load resistor (22a, 22b), a decoupling capacitor (24a, 24b), a series resistor (14a, 14b) and a series capacitance (16a, 16b);
said mixer branches (12a, 12b) are respectively connected to said oscillator input port (LO) and to said radio frequency input port (RF);
said two mixer branches produce intermediate signals;
said intermediate signals correspond to a Doppler shift between said oscillator signal and a radio frequency signal;
an output port outputting an overall output signal produced in said first mixer circuit; and,
a coupler is inserted between said oscillator and said receiving and transmission means.

12. Mixer structure according to claim 11, further comprising:
a second mixer circuit, said second mixer circuit includes: two mixer branches (12a, 12b), each mixer branch (12a, 12b) includes a rectifier circuit having a diode, a load resistor (22a, 22b) in parallel with said diode and a decoupling capacitor (24a, 24b) in parallel with said diode, a series resistor (14a, 14b) and a series capacitance (16a, 16b); and,
a second 3 dB coupler inserted between said oscillator and said receiving and transmission means, said first and second mixer circuits are positioned on two parallel arms (40), said 3 dB couplers (36) are shifted by one eighth of the wavelength of a signal wave relative to each other.

13. Mixer structure according to claim 11 wherein said mixer branch (12a) is separated from said mixer branch (12b) by a quarter wavelength.

14. Mixer structure according to claim 11 further comprising an automatic door, and wherein said circuit controls said automatic door.

15. Mixer structure (10; 110; 210; 310) for Doppler radar applications, comprising:
an oscillator input port (LO) for oscillator signals output from an electric oscillator (32);
a radio frequency input port (RF) for radio frequency signals from receiving means (34);
an output port (IF; $IF_I$, $IF_Q$) for outputting an overall output intermediate signal produced in the mixer structure (10; 110; 210; 310);
two mixer branches (12a, 12b), wherein each said mixer branch (12a, 12b) includes a rectifier circuit having a diode (18a, 18b; 118a, 118b), a decoupling capacitor (24a, 24b), a load resistor (22a, 22b), a series resistor (14a, 14b) and a series capacitance (16a, 16b), and,
said mixer branches (12a, 12b) are connected to said oscillator input port (LO) and said radio frequency port (RF) and to a common output port (IF; $IF_I$, $IF_Q$), said intermediate signals (IF1, IF2) of said mixer branches (12a, 12b) correspond to a Doppler shift between said oscillator signal and said radio frequency signal, and said intermediate signals are processed to an overall output intermediate signal.

16. Mixer structure according to claim 15, wherein said diodes (18a, 18b; 118a, 118b) are mounted in opposite directions.

17. Mixer structure according to claim 15, wherein each of said mixer branches (12a, 12b) includes a matching circuit (26a, 26b) to match the input impedance of said mixer branch (12a, 12b) with the impedance of a radio frequency input port line.

18. Mixer structure according to claim 15, wherein said mixer branches (12a, 12b) are connected to said oscillator input port (LO) and to said radio frequency input port (RF) by a 180° or 90° hybrid coupler (20; 120; 220).

19. Mixer structure according to claim 15, wherein said mixer branches (12a, 12b) are AC connected with said output port (IF) to an operational amplifier (28) in such a manner that said intermediate signals (IF1, IF2) are added to produce said overall output signal.

20. Mixer structure (210) according to claim 15, wherein said mixer structure (210) includes a 3 dB coupler (36) to retrieve said oscillator signal and said radio frequency signal required by said mixer structure (210), while leaving half of said oscillator signal power to reach connected receiving and transmission means (34) and to be transmitted.

21. Doppler radar sensor (30; 130; 230; 330), comprising:
an oscillator input port (LO) for oscillator signals output from an electric oscillator (32);
a radio frequency input port (RF) for radio frequency signals from receiving and transmission means (34);

an output port (IF; IF$_I$, IF$_Q$) for outputting an overall output intermediate signal produced in the mixer structure (10; 110; 210; 310);

two mixer branches (12a, 12b), wherein each said mixer branch (12a, 12b) includes a rectifier circuit having a diode (18a, 18b; 118a, 118b), a decoupling capacitor (24a, 24b), a load resistor (22a, 22b), a series resistor (14a, 14b) and a series capacitance (16a, 16b), said mixer branches (12a, 12b) are connected to said oscillator input port (LO) and said radio frequency port (RF) and to a common output port (IF; IF$_I$, IF$_Q$), said intermediate signals (IF1, IF2) of said mixer branches (12a, 12b) correspond to a Doppler shift between said oscillator signal and said radio frequency signal, and said intermediate signals are processed to an overall output intermediate signal;

an output port (IF; IF$_I$, IF$_Q$) for an overall output signal produced in said mixer structure (210; 310); and, said mixer structure (210; 310) resides between said oscillator (32) and said receiving and transmission means (34) of said Doppler sensor.

22. Doppler radar sensor according to claim 21 for usage with an automatic door.

23. Mixer circuit, comprising:

an oscillator generating oscillator signals;

an oscillator input port (LO);

said oscillator input port (LO) in electrical communication with said oscillator signals generated by said oscillator;

a receiving and transmission means;

a radio frequency input port (RF) for receiving radio frequency signals;

said radio frequency input port (RF) in electrical communication with said receiving and transmission means;

two mixer branches (12a, 12b), each mixer branch (12a, 12b) includes a rectifier circuit having a diode, a load resistor (22a, 22b), a decoupling capacitor (24a, 24b), a series resistor (14a, 14b) and a series capacitance (16a, 16b);

said mixer branches (12a, 12b) are respectively connected to said oscillator input port (LO) and to said radio frequency input port (RF);

said two mixer branches produce intermediate signals;

said intermediate signals correspond to a Doppler shift between said oscillator signal and a radio frequency signal;

an output port outputting an overall output signal produced in the mixer circuit; and, a first coupler (36) is inserted between said oscillator and said receiving and transmission means of said Doppler sensor, said first coupler is a 3 dB coupler to retrieve said oscillator and radio frequency signals leaving half of said signal power for said receiving and transmission means (34); and, a second coupler (220) is a 3 dB coupler is inserted between said first coupler and said mixer branches.

24. Mixer structure, comprising:

an oscillator generating an oscillator signal;

an oscillator input port (LO);

said oscillator input port (LO) in electrical communication with said oscillator signal generated by said oscillator;

a receiving and transmission means;

a radio frequency input port (RF) for receiving a radio frequency signal;

said radio frequency input port (RF) in electrical communication with said receiving and transmission means;

an in phase mixer circuit (IF$_I$) having first and second mixer branches (12a, 12b), each mixer branch (12a, 12b) includes a rectifier circuit having a diode (18a, 18b), a load resistor (22a, 22b), a decoupling capacitor (24a, 24b), a series resistor (14a, 14b) and a series capacitance (16a, 16b), said mixer branches (12a, 12b) are respectively connected to said oscillator input port (LO) and to said radio frequency input port (RF) using coupling means (36, 40, 220), said two mixer branches produce intermediate frequency signals, said intermediate frequency signals correspond to a Doppler frequency proportional to a Doppler shift between said oscillator signal and said radio frequency signal, an output port outputting an overall output signal produced in said in phase mixer circuit, a first coupler (36) is inserted between said oscillator and said receiving and transmission means of said Doppler sensor, and, a second coupler (220) is a 3 dB coupler inserted between said first coupler and said mixer branches (12a, 12b);

a quadrature phase mixer circuit (IF$_Q$) having first and second mixer branches (12a, 12b), each mixer branch (12a, 12b) includes a rectifier circuit having a diode (18a, 18b), a load resistor (22a, 22b), a decoupling capacitor (24a, 24b), a series resistor (14a, 14b) and a series capacitance (16a, 16b), said mixer branches (12a, 12b) are respectively connected to said oscillator input port (LO) and to said radio frequency input port (RF) using coupling means (36, 40, 220), said two mixer branches produce intermediate frequency signals, said intermediate frequency signals correspond to a Doppler frequency proportional to a Doppler shift between said oscillator signal and said radio frequency signal, an output port outputting an overall output signal produced in said quadrature mixer circuit, a third coupler (36) is inserted between said oscillator and said receiving and transmission means of said Doppler sensor, and, a fourth coupler (220) is a 3 dB coupler inserted between said third coupler and said mixer branches (12a, 12b); and, said in phase mixer circuit is connected by said first coupler to a first arm and said quadrature phase mixer circuit is connected by said third coupler to a second arm, said first and said second arms are in parallel and are connected to said oscillator input port (LO) and said radio frequency input port (RF), said first and said third couplers are positioned one eighth of the wavelength of a signal wave relative to each other.

25. Doppler radar sensor (30; 130; 230; 330), comprising:

an oscillator input port (LO) for oscillator signals output from an electric oscillator (32);

a radio frequency input port (RF) for radio frequency signals from receiving means (34);

an output port (IF; IF$_I$, IF$_Q$) for outputting an overall output intermediate signal produced in the mixer structure (10; 110; 210; 310);

a first mixer structure and a second mixer structure; each of said first and second mixer structures includes two mixer branches (12a, 12b), wherein each said mixer branch (12a, 12b) includes a rectifier circuit having a diode (18a, 18b; 118a, 118b), a decoupling capacitor (24a, 24b), a load resistor (22a, 22b), a series resistor (14a, 14b) and a series capacitance (16a, 16b);

said mixer branches (12a, 12b) are connected to said oscillator input port (LO) and said radio frequency port (RF) and to a common output port (IF; IF$_I$, IF$_Q$), said intermediate signals (IF1, IF2) of said mixer branches (12a, 12b) correspond to a Doppler shift between said oscillator signal and said radio frequency signal, and said intermediate signals are processed to an overall output intermediate signal;

an output port (IF; $IF_I$, $IF_Q$) for an overall output signal produced in said mixer structure (10; 210; 310);

said first mixer structure (10; 210; 310) and said second mixer structure reside between said oscillator (32) and said receiving and transmission means (34) of said Doppler radar sensor;

said first mixer structure (10; 210; 310) and said second mixer structure (10; 210; 310) reside between said oscillator (32) and said receiving and transmission means (34), each mixer structure (10; 210; 310) includes a 3 dB coupler, said first and second mixer structures (10; 210; 310) are positioned on two parallel arms (40), and, each of said 3 dB couplers (36) are shifted by one eighth of the wavelength of a signal wave relative to each other.

* * * * *

UNITED STATES PATENT AND TRADEMARK OFFICE
CERTIFICATE OF CORRECTION

| | | |
|---|---|---|
| PATENT NO. | : 8,384,586 B2 | Page 1 of 1 |
| APPLICATION NO. | : 13/273184 | |
| DATED | : February 26, 2013 | |
| INVENTOR(S) | : Borlez | |

It is certified that error appears in the above-identified patent and that said Letters Patent is hereby corrected as shown below:

On Title page, in column 1, under "Other Publications", line 2, delete "Applicaitons"" and insert -- Applications" --, therefor.

In the Specifications:

In column 1, line 12, delete "applications," and insert -- applications. --, therefor.

In column 2, line 6, delete "tight," and insert -- light, --, therefor.

In column 4, line 25, delete "leaf" and insert -- least --, therefor.

In column 7, line 61, delete "third," and insert -- third --, therefor.

In column 8, line 45, delete "target," and insert -- target. --, therefor.

In column 9, line 26, delete "IRQ" and insert -- IFQ --, therefor.

In the Claims:

In column 12, line 57, in Claim 20, after "structure" delete "(210)".

Signed and Sealed this
Sixth Day of August, 2013

Teresa Stanek Rea
*Acting Director of the United States Patent and Trademark Office*

UNITED STATES PATENT AND TRADEMARK OFFICE
CERTIFICATE OF CORRECTION

| | | |
|---|---|---|
| PATENT NO. | : 8,384,586 B2 | Page 1 of 1 |
| APPLICATION NO. | : 13/273184 | |
| DATED | : February 26, 2013 | |
| INVENTOR(S) | : Yves Borlez | |

It is certified that error appears in the above-identified patent and that said Letters Patent is hereby corrected as shown below:

This certificate supersedes the Certificate of Correction issued August 6, 2013. The certificate is vacated since request for Certificate of Correction was filed by a third party that is not associated with the patent application. The Certificate of Correction was published in error and should not have been issued.

Signed and Sealed this
Eleventh Day of November, 2014

Michelle K. Lee
*Deputy Director of the United States Patent and Trademark Office*

UNITED STATES PATENT AND TRADEMARK OFFICE
CERTIFICATE OF CORRECTION

PATENT NO. : 8,384,586 B2
APPLICATION NO. : 13/273184
DATED : February 26, 2013
INVENTOR(S) : Borlez Page 1 of 1

It is certified that error appears in the above-identified patent and that said Letters Patent is hereby corrected as shown below:

In the Specification,

Col. 1, line 12, after "radar" delete "applications," and insert -- applications. -- therefor.

Col. 2, line 6, after the first occurrence of "of" delete "tight," and insert -- light, -- therefor.

Col. 4, line 25, after "includes at" delete "leaf" and insert -- least -- therefor.

Col. 7, line 61, delete "third," and insert -- third -- therefor.

Col. 8, line 45, delete "target," and insert -- target. -- therefor.

Col. 9, line 26, delete "IRQ" and insert -- IFQ -- therefor.

Signed and Sealed this
Twenty-fourth Day of November, 2015

Michelle K. Lee
*Director of the United States Patent and Trademark Office*